(12) United States Patent
Ding et al.

(10) Patent No.: US 7,204,737 B2
(45) Date of Patent: Apr. 17, 2007

(54) HERMETICALLY SEALED MICRODEVICE WITH GETTER SHIELD

(75) Inventors: Xiaoyi Ding, Lake Zurich, IL (US); Jeffrey J. Frye, Grayslake, IL (US); John P. Schuster, Grayslake, IL (US)

(73) Assignee: Temic Automotive of North America, Inc., Deer Park, IL (US)

( * ) Notice: Subject to any disclaimer, the term of this patent is extended or adjusted under 35 U.S.C. 154(b) by 245 days.

(21) Appl. No.: 10/947,962

(22) Filed: Sep. 23, 2004

(65) Prior Publication Data

US 2006/0063462 A1    Mar. 23, 2006

(51) Int. Cl.
*H01J 9/00*    (2006.01)

(52) U.S. Cl. .......................... 445/24; 445/23
(58) Field of Classification Search .......... 445/3, 445/63, 24, 25; 313/547–549, 558–562; 417/48–51
See application file for complete search history.

(56) References Cited

U.S. PATENT DOCUMENTS

| 4,384,899 | A | 5/1983 | Myers |
| 4,639,631 | A | 1/1987 | Chason et al. |
| 5,173,836 | A | 12/1992 | Tomase et al. |
| 5,313,371 | A | 5/1994 | Knecht et al. |
| 5,365,790 | A | 11/1994 | Chen et al. |
| 5,553,502 | A | 9/1996 | Hsieh |
| 5,933,316 | A | 8/1999 | Ramakrishnan et al. |
| 6,416,831 | B1 | 7/2002 | Hara et al. |
| 6,499,354 | B1 | 12/2002 | Najafi et al. |
| 2003/0089394 | A1 | 5/2003 | Chang-Chien |
| 2003/0138656 | A1 | 7/2003 | Sparks |
| 2005/0118920 | A1 | 6/2005 | Lefort et al. |

FOREIGN PATENT DOCUMENTS

| EP | 1 167 979 A1 | 1/2002 |
| WO | WO 95/17014 A | 6/1995 |
| WO | WO 03/086957 A | 10/2003 |

OTHER PUBLICATIONS

Delevoye, E., Micro-Gyrometer, Esprit project: STARS + Eurimus project: GYROSIL, Design and Electronics developed by Thales Avionics, Design rules and process developed at LETI, PhD thesis, ASIC architecture developed at LETI, T3 Microsystems, CEA, LETI 5th Annual Review, Jun. 24th 2003, pp. 1-11.

(Continued)

*Primary Examiner*—Joseph Williams

(57) ABSTRACT

A microdevice that comprises a device microstructure (38) and vent channel (34) in a wafer (14) that is sandwiched between a substrate (10) and a cap (16). The cap (16) and substrate (10) have recesses (41, 21) around the microstructure (22) to define a cavity. A vent (25) is connected to the vent channel (34) and subsequently to the cavity. The vent (25) is used to evacuate and seal the microstructure (38) in the cavity. A getter layer (32) can be used to maintain the cavity vacuum. An electrical connection can be provided through the vent (25), vent channel (34) and cavity to the getter (32) to electrically ground the getter layer (32).

14 Claims, 3 Drawing Sheets

OTHER PUBLICATIONS

NanoGetters™, Our Technology, NanoGetter™ Intellectual Property, MEMS Applications Process, Bonding Process, http://www.nanogetters.com/technology.htm, http://www.nanogetters.com/bonding.htm, © NanoGetters, Inc. All rights reserved. Mar. 11, 2004.

Henmi, et al., "Vacuum Packaging for Microsensors by Glass-Silicon Anodic Bonding", Sensors and Actuators A., Elsevier Sequoia S.A. Lausanne, CH, vol. A43, No. 1/3, May 1, 1994, pp. 243-248, XP000454118, ISSN: 0924-4247, figures 1c, 2, 3.

Sparks, et al., "Reliable Vacuum Packaging using NanoGetters™ and Glass Frit Bonding", Proceedings of the SPIE, Reliability, Testing, and Characterization of MEMS/MOEMS III, Jan. 26-28, 2004, San Jose, CA, USA, vole. 5343, No. 1, 2003, pp. 70-78, XP002360338, ISSN: 0277-786X, figure 2.

Byeungleul, et al., "A Study on Wafer Level Vacuum Packaging for MEMS Devices", Journal of Micromechanics and Microengineering, vol. 13, No. 5, Sep. 2003, pp. 663-669, XP002360339, IOP Publishing UK; ISSN: 0960-1317, figures 1, 2, 5.

Chang-Chien, et al., "Wafer-Level Packaging using Localized Mass Deposition" Transducers '01 Eurosensors XV, 11th International Conference on Solid-State Sensors and Actuators, Digest of Technical Papers, Munich, Jun. 10-14, 2001, vol. 1, Jun. 10, 2001, pp. 182-185, XP002265234, Berlin, Germany, ISBN: 3-540-42150-5, figures 2-4, 6.

Caplet, et al., "Vacuum Wafer-Level Packaging for MEMS applications" Proceedings of the SPIE, Micromachining and Microfabrication Process Tehcnology VII, Jan. 27-29, 2003, San Jose, CA, USA, vol. 4979, 2003, pp. 271-278, XP 002360340, ISSN: 0277-786X, figure 8.

HERMETICALLY SEALED MICRODEVICE WITH GETTER SHIELD

FIELD OF THE INVENTION

This invention in general relates to microdevices having a structure that requires a vacuum cavity and, more particularly, to a microdevice and procedure for making a microdevice having a hermetically sealed vacuum in the cavity surrounding the microdevice.

BACKGROUND OF THE INVENTION

Microdevices having bonded conductive and insulating substrates can be fabricated with many different materials. A combination of metal, glass, and semiconductor materials are often used to create these devices and their packages. These materials are fused into a structure by many different processes as are known in the art. Some of these devices require a sealed chamber with a device therein and electrical connections to outside the package. There are very many microdevices that typically have a requirement for this type of structure. Considering the variety of devices, one feature many of these devices have in common is complex structures that must be contained in separate hermetic packaging, which can be difficult to manufacture and expensive to produce. In addition to packaging issues, there are operational issues.

For example, microdevices manufactured by MEMS technology are playing key roles in many areas. For instance, micromechanical gyroscopes have enabled several important control systems in transportation and commercial applications. Other microdevices such as pressure sensors, accelerometers, actuators and resonators fabricated by MEMS technology are also used in many areas. Some microdevices, such as micro gyroscopes and resonators contain a microstructure that not only needs to be hermetically sealed but also needs to be maintained within a vacuum-sealed cavity. For these types of devices, there is a continuing need to provide a vacuum environment and to improve the longevity of the vacuum. A vacuum-sealed cavity is typically susceptible to pressure increases due to gas generation during the hermetic sealing process and outgassing from the package material, sealing material, and components within the cavity. This pressure variation can degrade device performance and reduce device lifetime for many hermetically sealed microdevices. In addition, the packaging and/or equipment to provide an evacuated package can be complex and expensive.

It has been known to maintain a sealed vacuum within a cavity by using getters to adsorb vapor and gas species. Conventional gettering procedures have been met with varying degrees of success. For instance, with thick film getters there can be a reliability issue caused by getter particles falling down during fabrication process or after device experiencing vibration or shock due to poor mechanical strength and too large pore size of the used getter. The presence of separated getter particles has been identified as a major failure mode for some micro gyroscopes sealed with porous thick film getters. Additionally, because conventional getters typically have large pore size, the required size of the getter is normally large.

With relation to thin film getters, the mechanical properties of known amorphous or poly-crystalline silicon will change with deposition condition and are difficult to repeat. Known types of thin film getters are typically used in large sized cavities with large planar areas because of their limited thickness of only a couple of microns. It is, therefore, desirable to provide an improved microdevice and method of making a microdevice (such as a micro gyroscope) having a microstructure residing in a hermetically sealed cavity under a long term vacuum, that overcomes most, if not all, of the preceding problems.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, wherein:

FIG. 1 is a cross-sectional view of a substrate, silicon layer, and a cap, in accordance with the present invention;

FIG. 2 is a cross-sectional view of FIG. 1 with the addition of cap recess, substrate recess, metal electrodes and interconnects, in accordance with the present invention;

FIG. 3 is a cross-sectional view of the assembly of the silicon layer to the substrate of FIG. 2, in accordance with the present invention;

FIG. 4 is a top view of the assembly of FIG. 3, in accordance with the present invention;

FIG. 5 is a cross-sectional view of the final assembly of FIG. 3, in accordance with the present invention;

DETAILED DESCRIPTION OF THE PREFERRED EMBODIMENTS

The present invention is a packaging assembly for a microdevice and method therefor, which can provide a vacuum environment for the microdevice under a hermetic seal. The microdevice is provided in a simple assembly at a low cost and with a high reliability. In particular, the present invention provides a simple assembly structure that can be easily evacuated and hermetically sealed. Specifically, a vent channel is integrated in the same silicon wafer, and processed at the same time, when constructing the actual microdevice. Preferably, a metallic getter is incorporated into the package to maintain the vacuum, particularly in view of the various higher temperature sealing processes that can cause outgassing within the package. More preferably, the metallic getter is also used as an electrical shield and/or ground.

For purposes of illustration and description, an example of a micro gyroscope will be used as the microdevice. However, the present invention is not limited to the making and handling of micro gyroscopes but may also apply to other microdevices and structures that need to be maintained within a vacuum cavity. One of ordinary skill in the art having the benefit of this disclosure will realize that the devices and procedures described herein for making such devices could be used in other applications.

Figure 3:
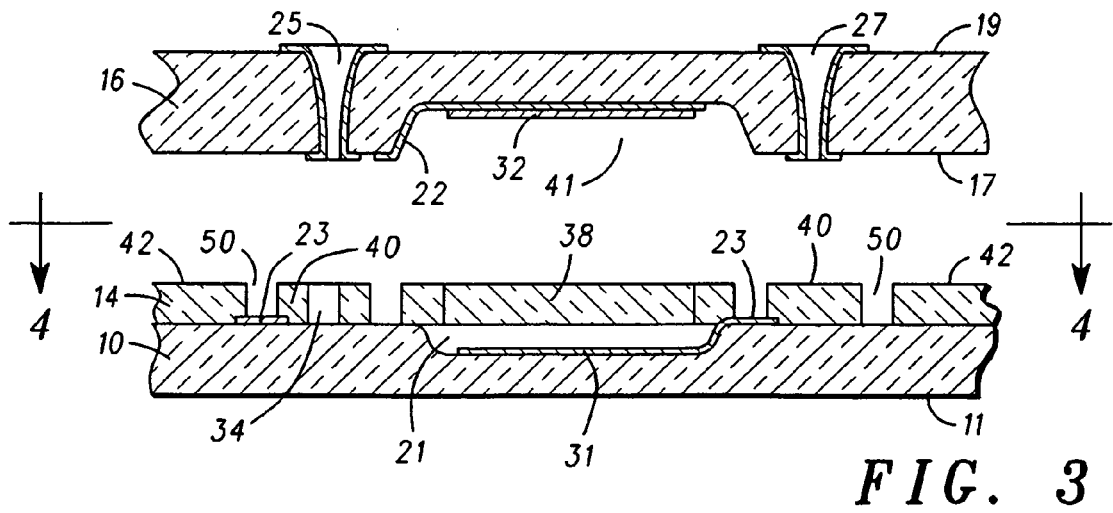
Figure 4:
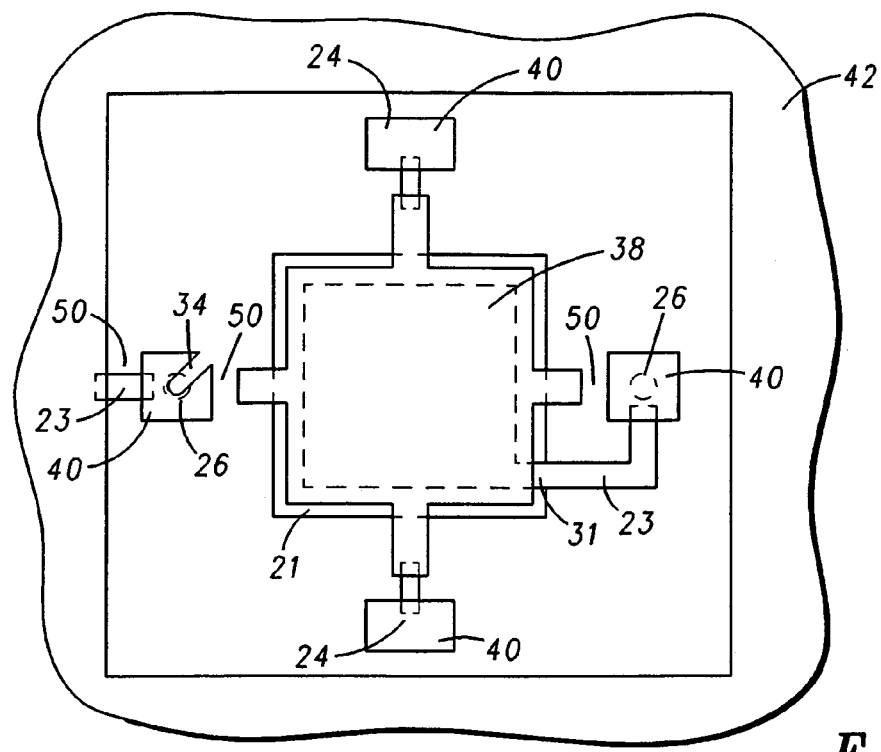
Figure 5:
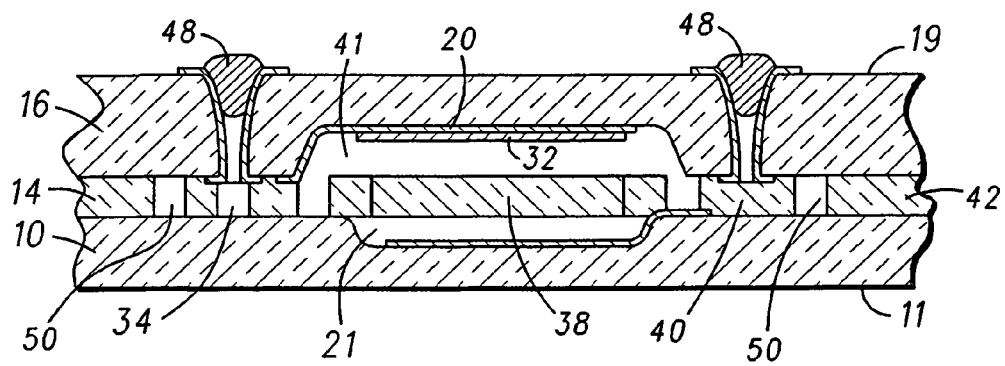

In FIGS. 1–5, an apparatus and method are illustrated to teach a fabrication process to make a vacuum enclosed microdevice in a hermetically sealed package, in accordance with the present invention. The present invention overcomes the deficiencies of the prior art because a vent channel to facilitate vacuum evacuation and sealing of the package is produced at the same time as the microdevice itself. The apparatus resulting from the application of the present method is shown in FIG. 5 and is used with further electronics (not shown) to be incorporated into a sensor system, such as a gyroscope sensor for a vehicle.

Figure 1:
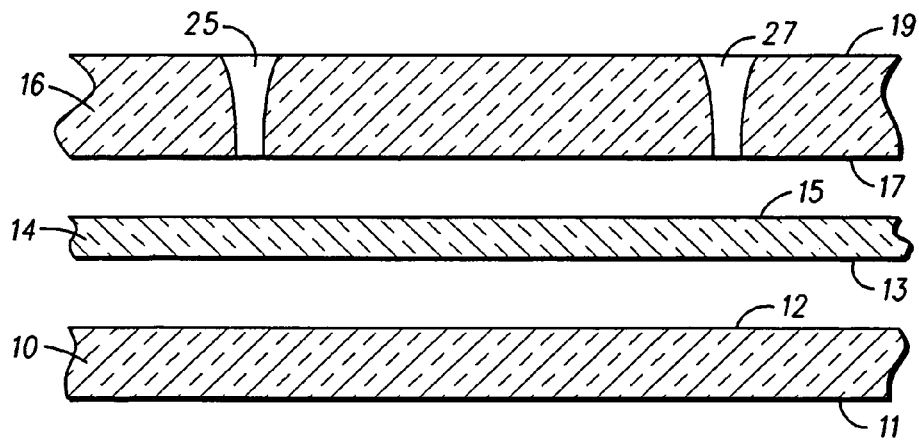
FIGS. 1–5 are cross-sectional views illustrating various process steps for providing a vacuum sealed microdevice, in accordance with the present invention.

Referring to FIG. 1, a substrate 10 is provided with a top surface 12 and a bottom surface 11. This substrate 10 is generally used as a support. Preferably, the substrate is made of glass. However, other insulating or conductive substrates, such as silicon, can also be used equally well for this function. A silicon device layer 14 is also provided with a top surface 15 and a bottom surface 13. Preferably, the semiconductive layer is a p-type, single-crystalline (100) silicon wafer. However, a polycrystalline material can also be used.

FIG. 1 also shows an insulating cap 16. The cap 16 is essentially a planar substrate and has a top surface 19 and an opposing bottom surface 17. Preferably, the cap is made of glass. However, other insulating or conductive substrates, such as silicon, can also be used. The cap can be provided as an individual piece per each microdevice assembly, or in a wafer form (as shown). A plurality of feedthroughs 25, 27 extend between the top and bottom surfaces 19, 17 of the cap 16. Preferably, the feedthroughs are abraded, such as with sand blasting. However, various techniques known in the art to make vias in glass or silicon can be used.

Figure 2:
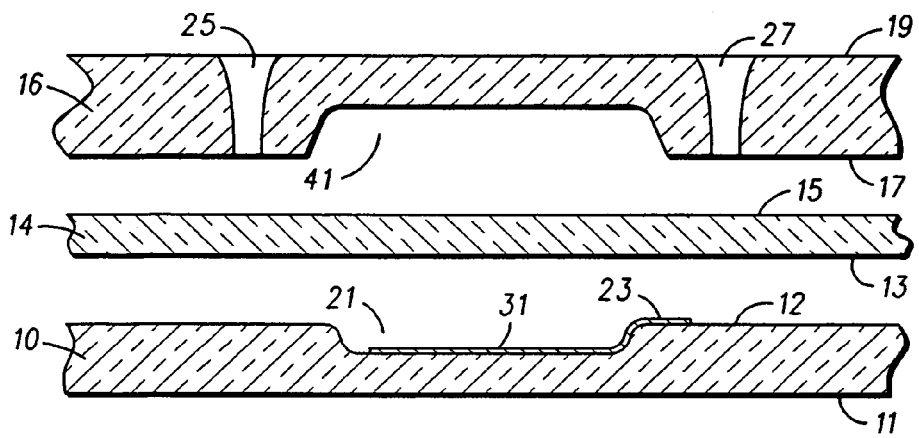

Referring to FIG. 2, the insulating cap 16 is patterned and etched on a bottom surface 17 as shown to define a cap recess 41. In addition, the substrate 10 is patterned and etched on a top surface 12 as shown to define a substrate recess 21. The patterning process used in this embodiment is a photolithographic process of applying photoresist, exposing and developing the photoresist, wet etching the surface on which the photoresist was applied, and then removing the photoresist. This process is commonly known to those of ordinary skill in the art, and typically uses a hydrofluoric or buffered hydrofluoric wet etch process. However, any known process can be used to achieve the recesses, tailored for the particular cap and substrate material.

At this point, a plurality of metal electrodes and interconnects 23 can be disposed on the substrate 10 to eventually provide electrical connections to bottom portions of the silicon device layer 14, as will be detailed below. At the same time, an electrical shield layer 31 can be defined, which can also be grounded. The layer 31 serves to shield the subsequently enclosed microstructure. Optionally, the layer 31 can also serve as an electrode to the microstructure. The metal film electrodes, interconnects 23 and shield layer 31 can be disposed using many known methods. In the preferred embodiment, a sputtering process is used. Preferably, the metal is gold with an adhesive and/or diffusion barrier metal (e.g. chromium, titanium/platinum, etc.) as are variously known in the art. The metal can be deposited and patterned using many different techniques, as are known in the art. The electrical connection from the metals interconnects 23 will eventually be through the silicon device layer 14 to one or more of the vias 25 and 27.

Referring to FIGS. 3 and 4, the silicon device layer wafer 14 is micromachined (i.e. patterned and etched) to define a microstructure 38 (e.g. gyroscope), at least one silicon interconnect islands 40, a vent channel 34, and enclosing silicon 42, which are connected together with mechanical release structures (not shown). All of these silicon devices 38, 40, 34 and 42 have the same resulting thickness. For example, the micromachining process can include defining a silicon etch pattern using a photolithographic process as is known in the art, and then etching the silicon device layer wafer 14 on one or both surfaces using reactive ion etch (RIE), deep reactive ion etch (DRIE), or wet etching using an appropriate chemical such as potassium hydroxide (KOH), ethylenediamine pyrocatechol (EDP) or tetramethyl ammonium hydroxide (TMAH), as are known in the art.

The silicon device layer 14 is then affixed to the substrate 10. Preferably, anodic bonding is used to bond the bottom surface 13 of the silicon device layer 14 to the top surface 12 of the substrate 10. However, it should be recognized that many various bonding techniques can be used such as fusion bonding, glass frit bonding, glass rebond, metal eutectic bonding, solder bond, and the like. The preferred anodic bonding is known in the art, and includes aligning and clamping the silicon and glass pieces, and applying a high voltage between them at a temperature higher than 280° C. At an elevated temperature and a high negative potential, the positive ions inside the glass drift away from the glass surface adjacent to the silicon into the bulk of the glass, and a high electric field is generated across the air gap between the glass and the silicon due to the depletion of positive ions at the interface. The high electrostatic forces clamp the two bonding surfaces very tightly to form a strong and uniform bond. It should be noted that the anodic bonding causes a diffusion of the metal interconnects 23 into the silicon to form a good electrical contact between the interconnects 23 and silicon surfaces being contacted. The anodic bonding can be performed in an inert atmosphere or in a vacuum.

Afterwards, the individual devices 38, 40, 34 and 42 are disconnected from each other by etching the release structures (not shown) using an appropriate etching method described above. It should be recognized that there are many other techniques available in the art to define microstructures, and that these techniques are all applicable in the present invention.

Isolation trenches 50 can also be formed in the silicon device layer wafer 14 to electrically isolate the interconnect islands 40 from themselves and from the microstructure 38 and cavity enclosing silicon 42. The vent channel 34 is formed within one of the interconnect islands 40, which is aligned with a vent via 25. The vent channel 34 couples the substrate recess 21 and cap recess 41 to the outside environment through the vent via 25.

Before enclosing the microstructure 38 with the cap, the glass cap wafer 16 is further processed to metalize the vent via 25 and feedthrough vias 27, and create a cap recess shield layer 22. In this way, the metal layer 22 serves to shield microstructure 38 and to electrically ground the getter layer 32 through the interconnect silicon island 40 with the vent channel 34 and the metal coating over the vent via 25. Alternatively, the metal layer 22 can be directly connected with the via 25. Preferably, via metals extend beyond each top and bottom orifice of the vias to form a shoulder to better facilitate an electrical connection after assembly. The metal material can be a composite of chromium/gold, or titanium/platinum/gold. The process involved can be either a selective metallization process, for example, the well known shadow mask process, or a combination of planar metallization and selective metal etching process well known in the art.

The metal electrodes and contacts can be configured to suit the particular microstructure 38 being manufactured. The particular traces for a gyroscope, for example, can be very complex and are not shown to simplify the drawings. However, it should be realized that many types of devices, with metal traces on one or both sides thereof, can be accommodated using the techniques as described herein. The assembly as shown provides for four via connections, wherein alignment points 26 align with two respective via holes 25, 27 to provide a connection to the microstructure 38 with metal layers 22, 23 and 31. Further vias (not shown) can be connected to other alignment points 24 to provide other electrical connections to metals 22, 31 or microstructure 38 as needed. It should be realized that a variety of different connection configurations can be provided by the present invention. In a preferred embodiment, at least one of the vias 25 is used to provide a connection to the getter shield 22, 32, as will be detailed below.

In a preferred embodiment, a getter layer 32 is disposed in one or more of the metalized recesses 41, 21. The getter layer 32 can be made of at least one or combination of metal components Titanium (Ti), Nickel (Ni), Palladium (Pd), Platinum (Pt), and Zirconium (Zr), etc.

FIG. 5 shows the glass cap 16 bonded to the remaining assembly 10, 14. The bottom surface 17 of the glass cap can be bonded anodically or electrostatically to the top surface 15 of the silicon device layer 14. Preferably, anodic bonding is used wherein a positive bias is applied to the silicon layer and a negative bias is applied to the glass layer. Anodic bonding is known in the art, as explained previously, and it should be noted that the anodic bonding causes a diffusion of the lower shoulders of the feedthroughs 25, 27 into the silicon to form a good electrical contact. The anodic bonding can be performed in an inert atmosphere or in a vacuum.

The fusing of the layers causes the recesses 21, 41 to form a cavity for the microstructure 38 wherein the microstructure is attached to the substrate 10 at various anchor points to float over the substrate recess 21 and below the cap recess 41. This allows at least a major body portion of the microstructure 38 to be suspended within the cavity. The microstructure may be a moving structure such as those used for a gyroscope or other microdevices.

The cavity formed by the recesses 21, 41 can be evacuated through the vent channel 34 that connects the vent via 25 with the cavity. The vias 25, 27 can then be sealed by melting a solder ball 48 in the vias 25, 27 to provide a hermetic seal for the microdevice package. The solder balls in each via 25, 27 also aid in providing an external, surface mountable, electrical connection, to complete the microdevice assembly. In the example above, multiple microdevice assemblies are produced in wafer form, requiring the dicing and separation of the wafer in the enclosing silicon portions 42 into individual microdevice packages. The process for dicing and separation can be done using many of the various techniques known in the art.

Figure 6:
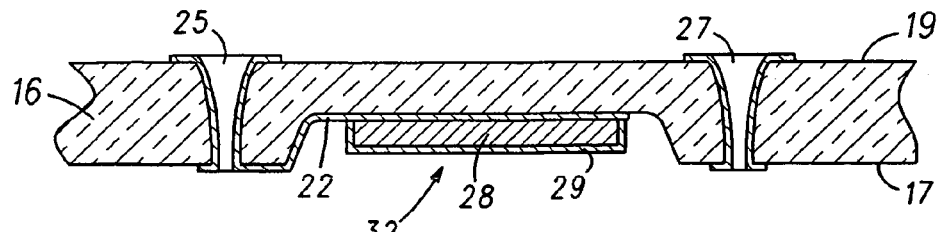
FIG. 6 is a cross-sectional view of an option to the getter layer of FIG. 3, in accordance with the present invention.

Referring to FIG. 6, in an optional embodiment, the getter layer 32 of FIGS. 3–5 is a thin metal film composite of a shield and/or ground layer 22, a getter layer 28, and a protection layer 29. The shield layer 22 (and 31 of FIGS. 2 and 3) covers the cavity surface and serves three functions. First, the shield layer(s) protects microstructure 38 from the external electric and magnetic interference. Second, the shield layer(s) protects the cap glass charging effect on device performance. Third, the shield layer(s) protects the cavity surface from releasing gas species into the cavity. In practice, the shield layer 22 (and 31) is made of three metal films: adhesion layer to glass surface (for example Ti), a low contact resistance layer to the interconnect silicon (for example Au), and a diffusion barring layer in between (for example Pt). The composition of thin getter layer 28 is dependent on the gas species to be sorpted. For example, the getter layer 28 could be anyone or combination of Titanium (Ti), Nickel (Ni), Palladium (Pd), Platinum (Pt), and Zirconium (Zr), etc. The protection layer 29 is a very thin layer, for example about fifty Å, of one or more noble metals such as Pt, which is not only a getter material but also an anti-oxidation layer to protect the major getter layer 28 from oxidation before the sealing.

Figure 7:
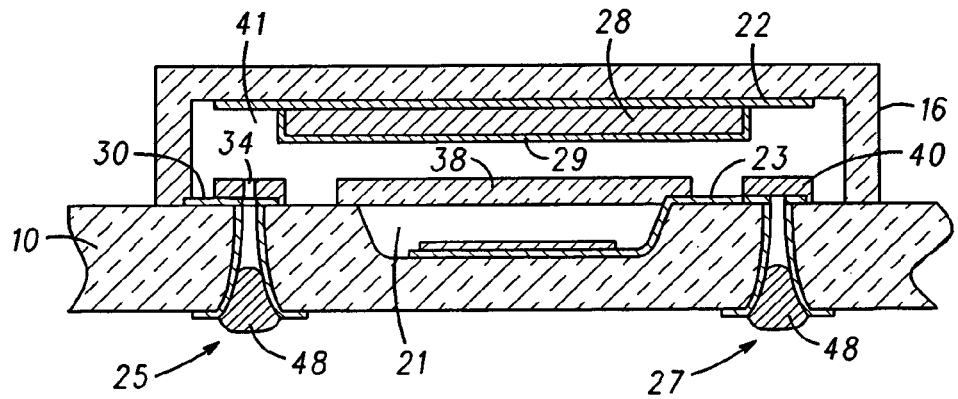
FIG. 7 is a cross-sectional view of an alternate embodiment of the assembly, in accordance with the present invention.

Referring to FIG. 7, an alternate embodiment of the present invention is shown. In this alternate embodiment, vias 25 and 27 are provided in the substrate 10 for evacuating the cavity and electrically connecting the microstructure. In addition, the vent channel 34 in this embodiment is formed in the interconnect silicon island being aligned with the vent via 25. This vent channel 34 connects the enclosed cavity to the outside of the assembly through the vent via 25. In addition, a singular silicon cap 16 is shown, for example. However, it should be realized that a wafer level sealing containing multiple units could also be used, as previously presented. The composite getter layer 20 can be electrically grounded through the silicon cap 16 to a metal trace 30 on the substrate 10, and then to outside the package through the metalized via 25. It should be recognized that there are many variations and combinations of vias and vent channels that can be used equally well in the present invention, and that these various embodiments can all be produced using the techniques outlined herein.

Figure 8:
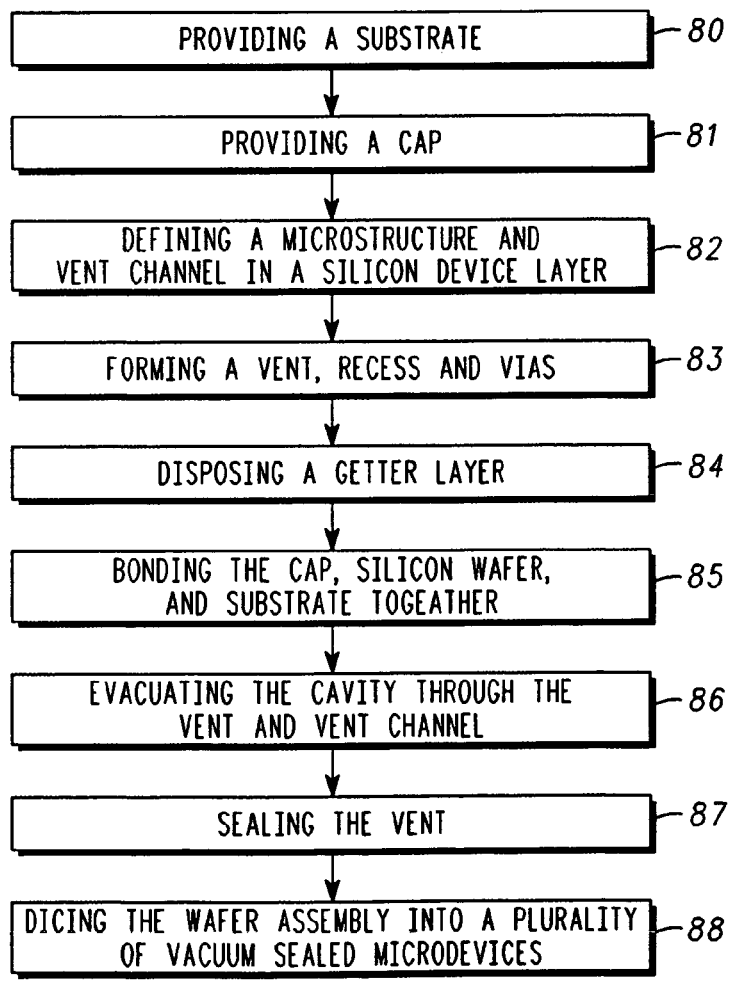
FIG. 8 is a flow chart of a method, in accordance with the present invention.

Referring to FIG. 8, the present invention defines a method for fabricating a hermetic microdevice assembly. A first step 80 includes providing a substrate. The substrate is further processed to provide a recess. A next step 81 includes providing a cap. The cap is further processed to provide a recess. A next step 82 includes defining a microstructure, a vent channel, at least one interconnect island, and enclosing silicon in a silicon wafer device layer. The vent channel is configured to couple to the recesses after the bonding step 86. This step 82 includes patterning and etching the silicon wafer to define the layer devices connected together by release structures.

A next step 83 includes forming at least one vent, consisting of a feedthrough via that is also used for an electrical connection for example, in one or more of the cap and substrate. A non-electrically connected via can also be used, but it should be metallized to facilitate solder sealing. The vent is configured to couple to the vent channel after the bonding step 86 to facilitate evacuation of the microdevice cavity after assembly. A next step includes disposing metal electrodes, interconnects, shield and ground layers, as needed. Specifically, this step 84 disposes metal film over all vias and their extended shoulders on both sides, and provides a shield metal layer over the cap and/or substrate recesses. The electrical connections to outside of the microdevice are provided through associated hermetically sealed feedthroughs by disposing metallization through the feedthrough apertures such that the metallization can contact the silicon layer after the bonding step 86. A next step 85 includes disposing a composite getter layer in the at least one recess (e.g. the cap and/or the substrate). Preferably, this step 85 includes disposing a three layer composite getter layer consisting of a shield layer, a getter layer, and a protection layer. In a preferred embodiment, the getter layer also serves as a shield and/or ground through appropriate connection with the metal layers of the metallization step 84. In particular, it is desirable to provide a step of providing an electrical connection through the vent and cavity to the getter layer to electrically ground the getter layer. In this way the getter layer can serve a dual purpose of gettering and shielding/grounding.

A next step 86 includes bonding the cap, silicon wafer, and substrate together such that the recess in the cap forms a cavity to enclose the microstructure. Preferably, this step 86 includes anodic bonding the silicon device layer wafer to the substrate, etching the release structures of the silicon devices, and bonding the cap to the microdevice wafer to form a hermetically sealed microdevice assembly. In particular, this step includes aligning the feedthrough aperture of the vent to the silicon layer such that vent abuts the vent channel, and the other vias abut any needed electrical connections after the bonding step 86. The process of bonding also couples the vent, vent channel, and cavity. In addition, the use of the silicon device layer can aid in completing certain electrical connections, as needed. For example, a ground via can be connected to the shield/ground layer and getter layer through a interconnect silicon island. Preferably, this step 86 includes wafer level bonding of multiple microdevices, which can be later diced and separated.

A next step 87 includes evacuating the cavity through the vent via and vent channel. A next step 88 includes sealing the vent via in vacuum to provide a hermetically sealed vacuum cavity enclosing the microstructure. Preferably, sealing is accomplished by solder sealing the vent. In practice, an appropriate low temperature solder ball is placed onto the via from the outer surface of the substrate or cap, the solder ball is degassed and melted in vacuum to hermetically seal the via.

A further step 89 includes dicing the wafer assembly into a plurality of vacuum sealed microdevices. Of course, persons of ordinary skill in the art will realize that the precise sequence of each step of this process may not be critical and other sequences could also be used to form this structure.

Because both anodic bonding and solder reflow can be done at a temperature lower than 350° C., the present invention can be used advantageously to encapsulate microdevices which can not withstand high post processing temperature. Additionally, the present invention provides a low temperature method to achieve microdevice encapsulation with very low cavity pressure. Low pressure is accomplished by providing a vent channel connecting the cavity to an open conductive via to prevent entrapment of the gases released during anodic bonding. The open via is finally vacuum sealed by a solder ball reflow at a low temperature, for example below 300° C. The solder ball is degassed in the vacuum system before the solder reflow. As a result of the solder ball degas and low temperature sealing process, the starting cavity pressure without getter can be as low as 100 millitorr. Since this low temperature seal process results in very little trapped gasses, a low cost composite metal film getter is sufficient for maintaining low pressure over long lifetime.

The composite metal film getter is easy to manufacture by using sputtering or evaporation techniques, and complete activation is accomplished during the low temperature solder reflow process. There is no need to have a special high temperature activation process. This is because the outer surface of the composite metal film getter has a thin anti-oxidation layer, and both anodic bonding and solder reflow are performed in high vacuum environments wherein the getter is not oxidized. The composite metal film getter is electrically connected to the grounding interconnect silicon through the shield layer, thus shielding the microdevice and minimizing any parasitic effect on device.

The present invention advantageously provides a simple method of packaging a hermetically sealed microdevice in a vacuum, by providing a vent channel and microdevice that are produced simultaneously with their associated packaging. The resulting device provides a solution to the problem of providing a low-cost and efficient microdevice, such as a gyroscope for example. The geometries of the constituent elements, including the substrate, the silicon layer, the glass cap and the various patterns as illustrated herein, are suitable for many different types of microdevices. Of course, other geometries may also be used to take advantage of the inventive process described. Although this embodiment details the construction and packaging of an gyroscope, this invention can have other application to devices produced simultaneously with their packaging and where a hermetic vacuum environment is required.

While the present invention has been particularly shown and described with reference to particular embodiments thereof, it will be understood by those skilled in the art that various changes may be made and equivalents substituted for elements thereof without departing from the broad scope of the invention. In addition, many modifications may be made to adapt a particular situation or material to the teachings of the invention without departing from the essential scope thereof. Therefore, it is intended that the invention not be limited to the particular embodiments disclosed herein, but that the invention will include all embodiments falling within the scope of the appended claims.

What is claimed is:

1. A method of making a hermetically sealed microdevice, the method comprising the steps of:
   providing a substrate with a recess therein;
   providing a cap with a recess therein;
   defining a microstructure and a vent channel in a silicon layer, the vent channel configured to couple to the recesses after the bonding step;
   forming a vent, the vent configured to couple to the vent channel after the bonding step;
   disposing a getter layer in at least one of the recesses;
   bonding the cap, silicon wafer, and substrate together such that the recesses in the cap and substrate form a cavity to enclose the microstructure, and wherein the vent, vent channel and cavity are coupled together;
   evacuating the cavity through the vent and vent channel; and
   sealing the vent to provide a hermetically sealed cavity enclosing the microstructure.

2. The method of claim 1, further comprising the step of providing an electrical connection through the vent and cavity to the getter layer to electrically ground the getter layer.

3. The method of claim 1, wherein the step of defining includes patterning and etching the silicon wafer to provide the microstructure and vent channel.

4. The method of claim 1, wherein the sealing step includes solder sealing the vent.

5. The method of claim 1, wherein the step of disposing the getter layer includes disposing a three layer composite getter layer consisting of a shield layer, a getter layer, and a protection layer.

6. The method of claim 1, wherein the step of bonding includes anodic bonding of the cap, silicon layer and substrate to form a microdevice assembly.

7. The method of claim 1, wherein the bonding step includes wafer level bonding of multiple microdevices.

8. The method of claim 1, wherein the forming step includes forming the vent in the substrate.

9. The method of claim 1, wherein the forming step includes forming the vent in the cap.

10. A method of making a hermetically sealed microdevice, the method comprising the steps of:
   providing a substrate with a recess therein;
   providing a cap with a recess therein;
   defining a microstructure and a vent channel in a silicon wafer, the vent channel configured to couple to the recesses after the bonding step;
   forming a vent the vent configured to couple to the vent channel after the bonding step;
   disposing metal interconnects;
   mounting the silicon wafer to the substrate;
   disposing a composite thin metal film getter in the recess of the cap and providing for a ground connection thereto;
   anodic bonding the cap to the silicon wafer such that the recess in the cap forms a cavity to enclose the microstructure and the vent is aligned with the vent channel, and the vent, vent channel and cavity are coupled together;
   evacuating the cavity through the vent and vent channel; and
   sealing the vent with solder to provide a hermetically sealed cavity enclosing the microstructure and to provide an external electrical ground connection to the getter layer.

11. The method of claim 10, wherein the composite thin metal film getter of the composing step consists of three layers: an electrical shield and outgassing block layer facing to the cap recess, a getter layer, and an outermost anti-oxidation layer.

12. The method of claim 10, wherein the step of anodic bonding includes anodic bonding the microdevice wafer to the substrate such that the microdevice wafer is sandwiched between the cap and substrate.

13. The method of claim 10, wherein the forming step includes forming the vent in the substrate.

14. The method of claim 10, wherein the forming step includes forming the vent in the cap.

* * * * *